United States Patent [19]

Nakashima et al.

[11] Patent Number: 5,187,558
[45] Date of Patent: Feb. 16, 1993

[54] STRESS REDUCTION STRUCTURE FOR A RESIN SEALED SEMICONDUCTOR DEVICE

[75] Inventors: Yuichi Nakashima; Mitsuhiro Tomikawa; Hirohisa Yamamoto, all of Hyogo, Japan

[73] Assignee: Mitsubishi Denki Kabushiki Kaisha, Tokyo, Japan

[21] Appl. No.: 517,628

[22] Filed: May 1, 1990

[30] Foreign Application Priority Data

May 8, 1989 [JP] Japan .................................. 1-114502
Sep. 1, 1989 [JP] Japan .................................. 1-227980

[51] Int. Cl.⁵ .......................................... H01L 23/28
[52] U.S. Cl. .................................. 257/420; 257/396; 257/620; 257/787
[58] Field of Search .................. 357/52, 54, 26, 23.11, 357/72

[56] References Cited

U.S. PATENT DOCUMENTS

| | | | |
|---|---|---|---|
| 4,453,174 | 6/1984 | Kawasaki et al. | 357/26 |
| 4,481,526 | 11/1984 | Miyasaka | 357/52 |
| 4,625,227 | 11/1986 | Hara et al. | 357/52 |
| 4,799,099 | 1/1989 | Verret et al. | 357/47 |
| 4,841,354 | 6/1989 | Inaba | 357/52 |
| 4,903,118 | 2/1990 | Iwade | 357/72 |
| 4,928,162 | 5/1990 | Lesk et al. | 357/52 |
| 4,933,744 | 6/1990 | Segawa et al. | 357/72 |

Primary Examiner—William D. Larkins
Attorney, Agent, or Firm—Lowe, Price, LeBlanc & Becker

[57] ABSTRACT

A resin sealed semiconductor device includes a semiconductor chip formed on a substrate and sealed with resin. A concave portion is formed on a major surface of a semiconductor substrate between an insulating film for isolation and an edge of the major surface of the semiconductor substrate. This concave portion is filled with a buffer member having an elastic modulus smaller than that of the material of the semiconductor substrate. Mechanical stress applied to an edge of the semiconductor substrate, caused by the callosity of resin, is absorbed and reduced by the buffer member. A portion of the semiconductor substrate between the concave portion and the insulating film for isolation prevents the remainder of the mechanical stress from being transmitted from the buffer member to the insulating film and circuit elements.

1 Claim, 7 Drawing Sheets 103c  109  103b  107  103a  101
                                    105

STRESS REDUCTION STRUCTURE FOR A RESIN SEALED SEMICONDUCTOR DEVICE

BACKGROUND OF THE INVENTION

1. Field of the Invention

This invention relates to resin sealed semiconductor devices, and more particularly to a structure of such devices having reduced mechanical stress caused by shrinkage of resins applied to elements formed near the sidewall surfaces of a major surface of a semiconductor substrate.

2. Description of the Background Art

FIG. 8 is a front sectional view of a conventional resin sealed semiconductor device. As shown in FIG. 8, a semiconductor chip 1 is soldered onto a die pad 2 of a metal plate. The semiconductor chip 1 includes an integrated circuit formed on the major surface of a semiconductor substrate, and a surface protecting film deposited thereon. External leads 3 are provided on both side surfaces of the semiconductor chip 1. Bonding pads 4 are provided near the sidewall surfaces of the major surface of the semiconductor chip 1, and the bonding pads 4 and the external leads 3 are electrically connected to each other by wires 5. The semiconductor chip 1, the die pad 2, portions of the external leads 3, the bonding pads 4 and wires 5 are all sealed with resin 6.

FIG. 9 is a plan view of this semiconductor device. As shown in FIG. 9, the semiconductor chip 1 is mounted on the surface of the die pad 2. A plurality of bonding pads 4 are formed near the sidewall surfaces of the major surface of the semiconductor chip 1. A plurality of external leads 3 are provided on both side surfaces of the semiconductor chip 1 and are electrically connected to the bonding pads 4 by the wires 5, respectively. The semiconductor chip 1, the die pad 2, the portions of the external leads 3, the bonding pads 4 and the wires 5 are all sealed with resin 6.

FIG. 10 is an enlarged view of a portion denoted by the arrow X in FIG. 9. This portion comprises a MOS (Metal Oxide Semiconductor) field effect transistor. A source region 8 and a drain region 9 are formed on the major surface of the semiconductor substrate 7. The source and drain regions 8 and 9 are formed by diffusion of n type or p type impurities in the major surface of the semiconductor substrate 7. The source region 8 is electrically connected to an aluminum interconnection layer 15 through a contact hole. The drain region 9 is electrically connected to an aluminum interconnection layer 16 through the contact hole. A gate electrode 10 made of polysilicon is formed on a channel forming region between the source and drain regions 8 and 9. The end portion of the gate electrode 10 is electrically connected to an aluminum interconnection layer 17 through the contact hole. The aluminum interconnection layer 17 is electrically connected to the bonding pad 4 formed of aluminum. Patterning of deposited aluminum forms the bonding pad 4 and the aluminum interconnection layer 17. Thus, the bonding pad 4 and aluminum interconnection layer 17 are formed at the same time, and the bonding pad 4 and the external lead 3 are electrically connected to each other by the wire 5. Field oxide films 11a and 11b which are insulating films for isolation, are formed with the source and drain regions 8 and 9 sandwiched therebetween, the field oxide films being positioned on a portion of the major surface of the semiconductor substrate 7 other than the source and drain regions 8 and 9.

FIG. 11 is a cross sectional view of the semiconductor device taken along the line XI—XI of FIG. 10. As shown in FIG. 11, the semiconductor substrate 7 is mounted on a major surface of the die pad 2. The field oxide films 11a and 11b are formed on a major surface of the semiconductor substrate 7, and a thin gate oxide film 12 is formed between the field oxide films 11a and 11b. The gate electrode 10 is formed on the field oxide films 11a and 11b and on the gate oxide film 12. An interlayer insulating film 13 made of a phospho-silicate glass is deposited on the gate electrode 10. A contact hole 18 is formed in the interlayer insulating film 13 on the end portion of the gate electrode 10. The aluminum interconnection layer 17 is formed on the interlayer insulating film 13. The aluminum interconnection layer 17 and the gate electrode 10 are electrically connected to each other through aluminum filling the contact hole 18. A passivation film 14 is deposited on the interlayer insulating film 13 and on the aluminum interconnection layer 17. The passivation film 14 serves as a surface protecting film.

As a method of sealing a semiconductor chip, two methods are employed: one is sealing with a resin and the other is hermetic sealing with a ceramic package or the like. Since the resin is less expensive than the ceramic package, the method of sealing the semiconductor chip with the resin is more widely used.

For the resin sealed semiconductor device, however, it is known that mechanical stress caused by shrinkage of resin is applied to a semiconductor element, resulting in deterioration in the electrical characteristics of the semiconductor element. This will now be described with reference to the results of an experiment.

This experiment was carried out by employing a MOS capacitor formed on a TEG (Test Element Group) chip. The TEG chip has a semiconductor substrate on which elements and interconnections are formed. An example of application of the TEG chip will be described. Before application of a MOS transistor of a new size to the semiconductor device, the MOS transistor is previously formed on the TEG chip to carry out tests of reliability. After reliability of the MOS transistor can be confirmed, the MOS transistor becomes applicable in practice to the semiconductor device.

FIG. 12 is a sectional view of the MOS capacitor formed on the TEG chip. The MOS capacitor 27 has a p type silicon substrate 21, a thin oxide film 23 formed on this substrate, and an electrode 24 of polysilicon formed on the thin oxide film 23. Field oxide films 22a and 22b are formed on both end portions of the thin oxide film 23.

An electrode 25 made of aluminum is formed on one end portion of the electrode 24 made of polysilicon. The p type silicon substrate 21 is grounded. A current source 26 is connected to the aluminum electrode 25, and its minus (−) connected to the aluminum electrode 25 and its plus (+) grounded.

Two types of the TEG chips are prepared: a resin sealed TEG chip having the aforementioned MOS capacitor and a non-sealed TEG chip without resin having the aforementioned MOS capacitor. A continuous flow of current through the MOS capacitor formed on each of the TEG chips causes electric stress to be applied to the MOS capacitor and thus makes a flat band voltage of the MOS capacitor to shift by a predetermined amount. The flat band voltage is a voltage to be applied to a gate electrode in order to make a surface electric field at an interface between the gate oxide film and semiconductor substrate decrease to zero. As the flat band voltage of a MOS capacitor is shifted, electrical characteristics of the MOS capacitor deteriorate.

The conditions of flat band voltage shifted are described with reference to FIG. 13, which is a graph showing a C-V characteristic of a given MOS capacitor. The ordinate C indicates a capacitance, while the abscissa V indicates a voltage, in the graph. The curve denoted with reference number 91 represents the relationship between the capacitance and voltage of the MOS capacitor before electric stresses are applied to the MOS capacitor. The curve denoted with reference number 92 represents the relationship between the capacitance and voltage of the MOS capacitor after electric stresses are applied to the MOS capacitor. The capacitance is varied in a certain range of voltage displacement with respect to both the curves 91 and 92. The flat band voltage is within this range of voltage displacement. Assuming that the flat band voltage before electrical stresses are applied is denoted with a, and the flat band voltage after electrical stresses are applied is denoted with b, the amount of shifting the flat band voltage is expressed as $\Delta V = b - a$.

The time required for shifting the flat band voltage is measured at constant current densities of 10 pA/cm$^2$, 20 pA/cm$^2$ and 40 pA/cm$^2$, respectively. The amount of the flat band voltage to be shifted is all the same at the respective values of the constant current densities. The constant current density is a value obtained by division of a constant current by the area of portions of the polysilicon electrode 24 on the thin oxide film 23. It is assumed that the time required for shifting a predetermined amount of the flat band voltage in the MOS capacitor of the no-resin sealed TEG chip is 100 at a constant current density of 10 pA/cm$^2$.

FIG. 14 is a graph showing the result of the experiment. The dotted line indicates the result of the experiment of the MOS capacitor of the no-resin sealed TEG chip, while the solid line indicates that of the MOS capacitor of the resin sealed TEG chip. As shown in FIG. 14, the MOS capacitor of the no-resin sealed TEG chip requires a longer period of time to shift the flat band voltage than the MOS capacitor of the resin sealed TEG chip at a constant current density lower than 40 pA/cm$^2$. As described above, shifting of the flat band voltage deteriorates the electrical characteristics of the semiconductor elements. Therefore, the electrical characteristics of the resin sealed semiconductor device deteriorate more rapidly than those of the hermetic sealed semiconductor device.

In the resin sealed semiconductor device, the electrical characteristics of the elements formed near the sidewall surfaces of the major surface of the semiconductor substrate deteriorate more rapidly than those of the elements formed in the middle of the major surface of the semiconductor substrate. This results from the fact that the mechanical stress caused by sealing with a resin is applied from the directions of the upper surface, the lower surface and the side surface of the semiconductor substrate 7, as shown by the arrows A in FIG. 11. The mechanical stress applied from above and below the substrate is applied uniformly onto all the elements formed on the major surface of the semiconductor substrate. On the other hand, the mechanical stress applied from the sides of the substrate is more heavily concentrated on the elements at the sidewall surfaces of the semiconductor substrate, than the elements in the middle of the major surface of the semiconductor substrate. Therefore, greater mechanical stress is applied to the elements at the sidewall surfaces of the major surface of the semiconductor substrate than those in the middle of the major surface of the semiconductor substrate. As a result, the electrical characteristics of the elements in the sidewall surfaces of the major surface of the semiconductor substrate deteriorate more rapidly than those of the elements in the middle of the major surface of the semiconductor substrate.

Particularly, the elements located within 100 μm from the sidewall surface of the semiconductor substrate have their electrical characteristics rapidly deteriorated by the mechanical stress. Since elements are formed within 100 μm from the edges of the semiconductor substrate due to high integration of the semiconductor device, the deterioration of the electrical characteristics of the semiconductor elements due to the mechanical stress is a major problem.

SUMMARY OF THE INVENTION

It is an object of this invention to provide a resin sealed semiconductor device having such a structure that mechanical stresses caused by resin encapsulation are reduced when applied to electrical elements formed near the sidewall surfaces portions of a major surface of a semiconductor substrate.

It is another object of this invention to provide a resin sealed semiconductor device having an insulating film for isolation and a buffer member for mechanical stresses, formed at the same time.

It is a further object of this invention to provide a resin sealed semiconductor device having an insulating film for isolation and a buffer member, formed by local oxidation of silicon at the same time.

It is a still further object of this invention to provide a resin sealed semiconductor device having such a structure that mechanical stresses caused by resin encapsulation are reduced when applied to electrical elements having a pn junction formed near the sidewall surfaces of a semiconductor substrate.

It is a still further object of this invention to provide a method of manufacturing a semiconductor device having such a structure that mechanical stresses are reduced.

It is a still further object of this invention to provide a semiconductor device having such a structure that mechanical stresses are reduced.

According to a first aspect, this invention is directed to a resin sealed semiconductor device having a semiconductor chip sealed with resin, comprising a semiconductor substrate having a major surface, an electrical element formed near a sidewall surface of the major surface of the semiconductor substrate, and an insulating film for isolation formed around the electrical element on the major surface to electrically isolate the electrical element from other electrical elements on the substrate.

A concave portion is formed in a region, apart from the insulating film for isolation, on the major surface of the semiconductor substrate located between a side edge of the semiconductor substrate and an external edge of the insulating film for isolation directed to the side edge. A buffer member fills in the concave portion, and is made of a material having a lower elastic modulus than the material of the semiconductor substrate.

According to a second aspect, a semiconductor integrated circuit of this invention includes a substrate having a predetermined modulus of elasticity, at least one electrical element formed on the substrate, and a structure formed thereon for reducing mechanical stresses in the substrate caused by resin encapsulation. The structure for reducing mechanical stresses includes a concave portion, a field oxide region and an intermediate region laterally displaced from the electrical element. The concave portion is formed in a major surface of the substrate proximate the periphery thereof and contains a material of lower modulus of elasticity than the substrate. The field oxide region is formed at the major surface of the substrate between the electrical element and the concave portion. The intermediate region is provided between the concave portion and the field oxide region and has a modulus of elasticity equal to or greater than the modulus of elasticity of the substrate. The further region is affixed to the substrate.

According to a third aspect, a semiconductor integrated circuit of this invention includes a substrate having a predetermined modulus of elasticity and a structure formed thereon for reducing mechanical stresses in the substrate caused by resin encapsulation. The structure for reducing mechanical stresses includes a concave portion and an intermediate region. The concave portion is formed in a major surface of the substrate proximate the periphery thereof and contains a material of lower modulus of elasticity than the substrate. The intermediate region is located at an end of the concave portion, with the concave portion positioned between an end of the substrate and the intermediate portion. The intermediate portion has a modulus of elasticity greater than that of the material contained in the concave portion. The intermediate region is affixed to the substrate and is laterally displaced from electrical elements on the substrate.

According to a fourth aspect, a semiconductor device of this invention includes a substrate having a major surface and a structure for reducing mechanical stresses to be applied to the substrate. A concave portion is formed proximate to and along the entire periphery of the major surface. A buffer member containing a material of lower modulus of elasticity than that of the substrate is formed in the concave portion. The buffer member serves to reduce mechanical stresses. A stress transmission preventing member is provided in a major surface more inward than the concave portion. The stress transmission preventing member contains a material of modulus of elasticity equal to or greater than that of the substrate and prevents the transmission of mechanical stresses.

According to a fifth aspect, this invention is directed to a method of manufacturing a stress-resistant semiconductor integrated circuit including a substrate having a predetermined modulus of elasticity and at least one electrical element. This method includes the steps of forming a concave portion in the substrate, filling the concave portion with a material having a smaller modulus of elasticity than that of the substrate, and forming a field oxide region between the concave portion and a location of at least one electrical element and spaced therefrom by a predetermined distance.

In accordance with this invention, mechanical stresses are absorbed and reduced by the material having a smaller modulus of elasticity than the substrate and provided in the concave portion formed in the major surface of the substrate. A region provided in the major surface of the substrate more inward than the concave portion and having a modulus of elasticity equal to or greater than that of the substrate prevents the reduced mechanical stresses from being transmitted to an element forming area.

The mechanical stresses employed in this case are, for example, mechanical stresses caused by resin encapsulation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
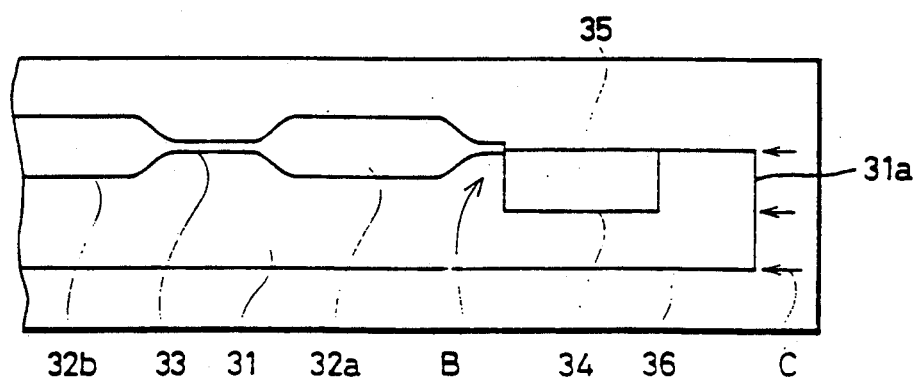
FIG. 6 is a cross sectional view of the end portion of a semiconductor substrate of a first embodiment of this invention.

The first embodiment of this invention is shown in FIG. 6, a cross sectional view of the vicinity of the end portions of the semiconductor substrate. As shown in FIG. 6, field oxide films 32a and 32b are formed in a major surface of a semiconductor substrate 31. A thin oxide film 33 is formed between the field oxide films 32a and 32b. The thin oxide film 33 is an element forming region. A concave portion 34 is formed between the field oxide film 32a and the end portion 31a of the semiconductor substrate 31, in the major surface thereof. The concave portion 34 is filled with a buffer member 35 having a smaller elastic modulus than that of the semiconductor substrate 31. A portion of the semiconductor substrate shown by the arrow B is between the concave portion 34 and the field oxide film 32a. The semiconductor substrate 31 is surrounded by resin 36.

Since the buffer member 35 has a smaller elastic modulus than that of the semiconductor substrate 31, the buffer member 35 is softer than the semiconductor substrate 31, as apparently seen from the expression $\sigma = E\epsilon$ which shows the relation of stress σ, strain ε and an elastic modulus E. Therefore, the buffer member 35 absorbs more mechanical stresses than the semiconductor substrate 31. The mechanical stresses applied from the direction of the arrow C due to resin shrinkage are thereby absorbed and reduced in the buffer member 35.

A portion of the semiconductor substrate 31 shown by the arrow B is located between the field oxide film 32a and the concave portion 34. The field oxide film 32a is softer than the semiconductor substrate 31. Accordingly, contact between the field oxide film 32a and the concave portion 34 causes the stresses transmitted to the buffer member 35 to be transmitted to the field oxide film 32a and consequently to the thin oxide film 33 of the element forming region. Thus, the portion of the semiconductor substrate 31 shown by the arrow B is located between the field oxide film 32a and the concave portion 34. Some of mechanical stress not absorbed and reduced in the buffer members 35 are transmitted to the portion of the semiconductor substrate 31 shown by the arrow B. This stress is prevented from being transmitted to the thin oxide film 33 of the element forming region by the portion of the substrate located at B.

Figure 7:
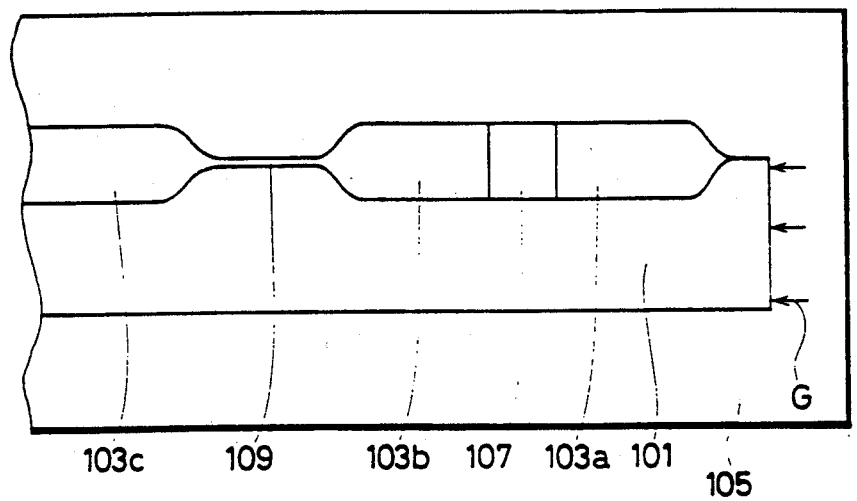
FIG. 7 is a cross sectional view of the end portion of a silicon substrate of a second embodiment of this invention.
Figure 8:
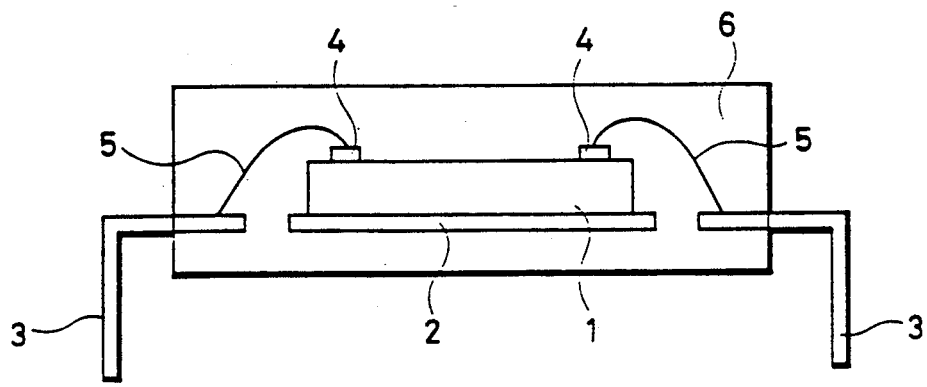
FIG. 8 is a front sectional view of a conventional resin sealed semiconductor device.
Figure 9:
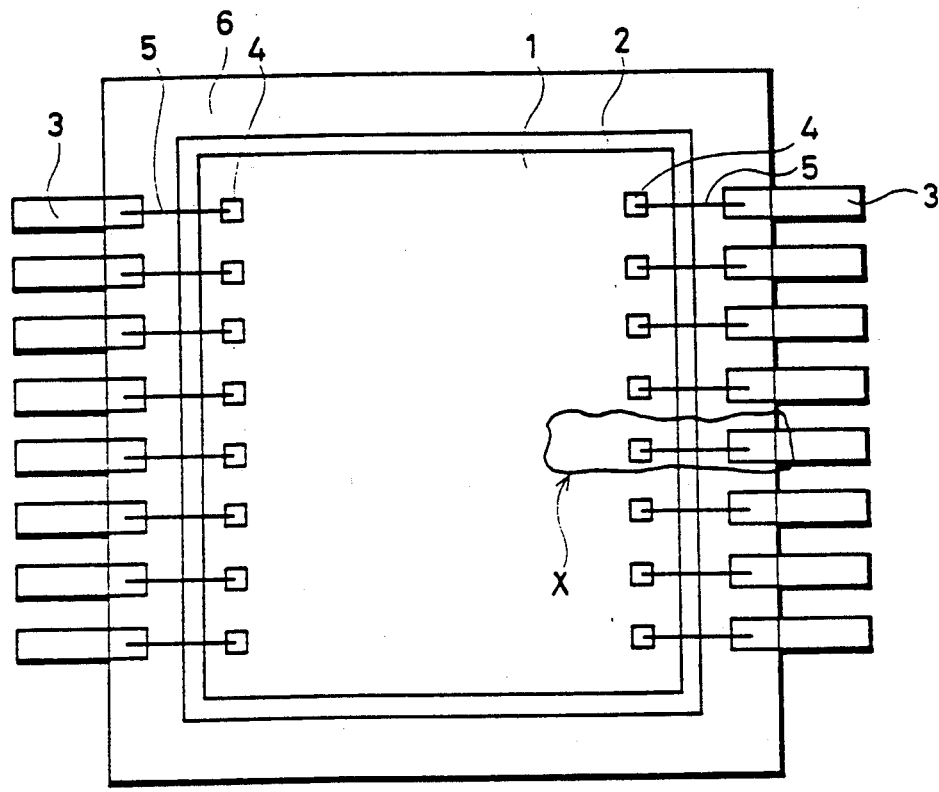
FIG. 9 is a plan view of the conventional resin sealed semiconductor device.
Figure 10:
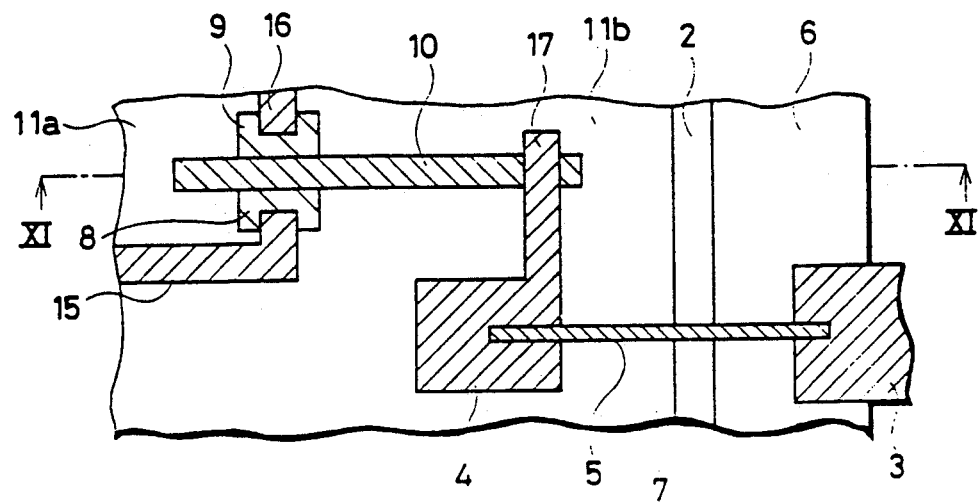
FIG. 10 is an enlarged view of a portion denoted with the arrow X of FIG. 9.
Figure 11:
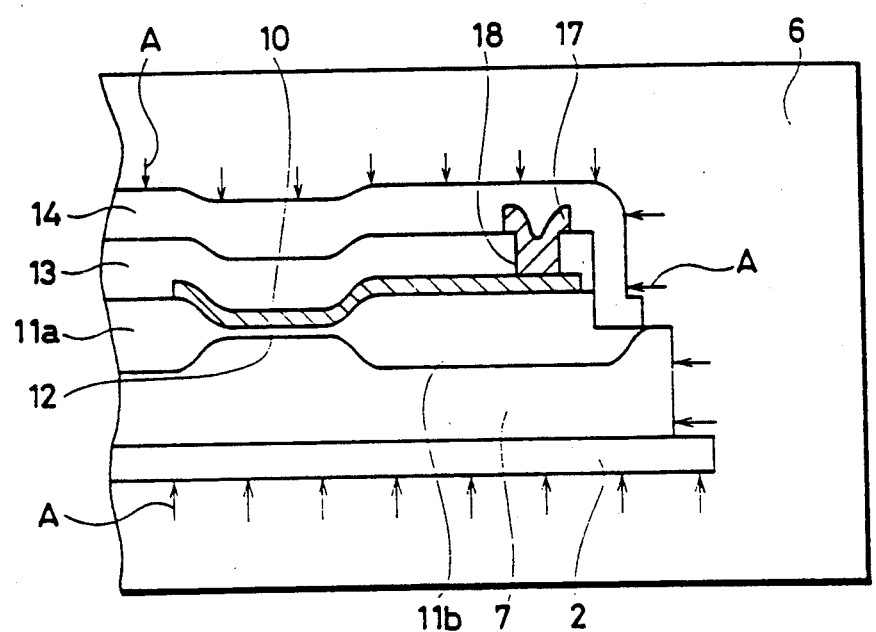
FIG. 11 is a cross sectional view taken along the direction of the arrows XI—XI of FIG. 10.
Figure 12:
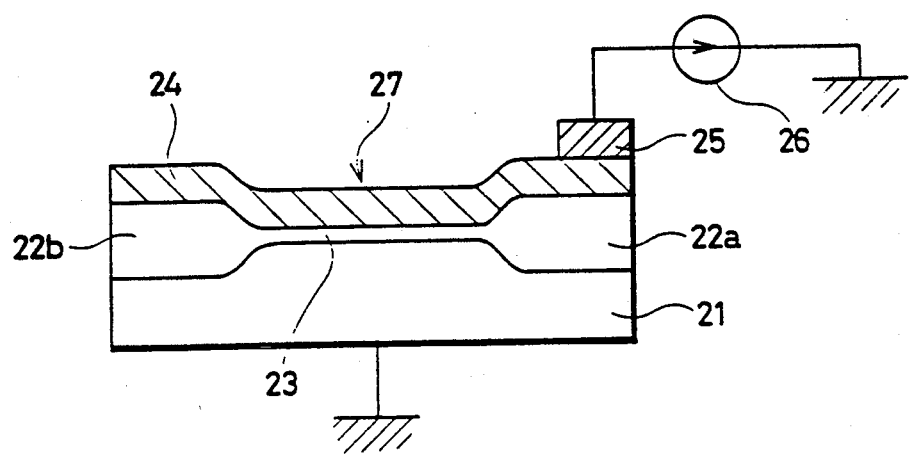
FIGS. 12-14 are diagrams for describing that mechanical stresses cause degradation of electrical characteristics.
Figure 13:
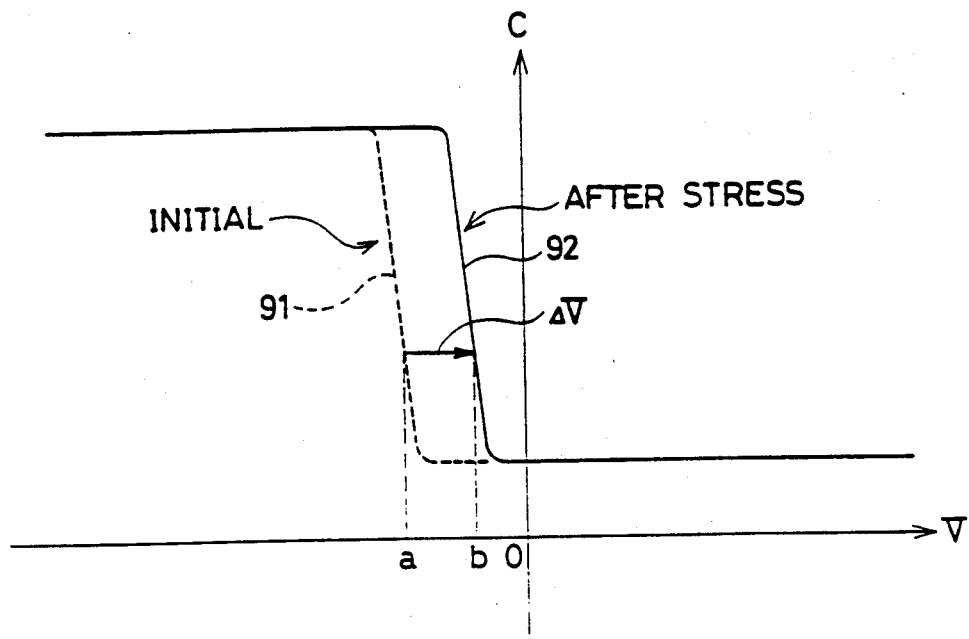
Figure 14:
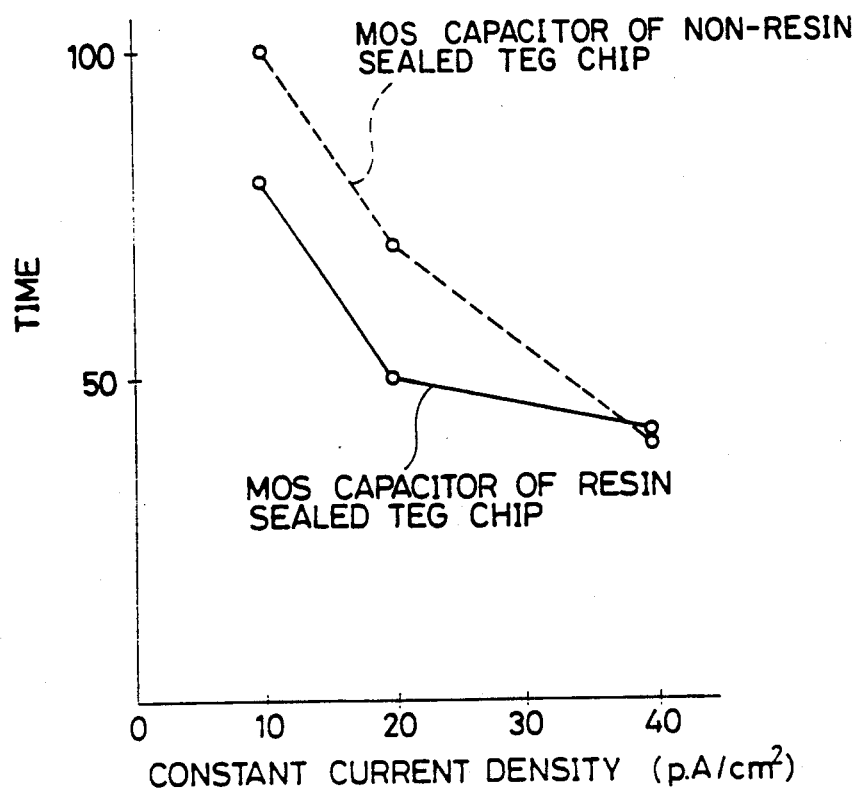

The second embodiment of this invention is FIG. 7, a cross sectional view showing the vicinity near a sidewall surface of a silicon substrate. Field oxide films 103a, 103b and 103c are formed on a major surface of a silicon substrate 101. A thin silicon oxide film 109 is formed between the field oxide films 103b and 103c. The thin silicon oxide film 109 is in an element forming region.

Diamond 107 is provided between the field oxide films 103a and 103b. The diamond 107 is affixed on the silicon substrate 101 and functions the same as the portion of the silicon substrate shown by the arrow B of FIG. 6. The silicon substrate 101 on which the field oxide film 103a and the like are formed is sealed with resin 105.

In the second embodiment, mechanical stresses applied from the direction of the arrows G due to resin encapsulation are absorbed and reduced in the field oxide film 103a. Since diamond 107 has a higher modulus of elasticity than silicon, it is harder than the silicon substrate 101. The diamond 107 prevents the reduced mechanical stresses from being transmitted to the thin silicon oxide film 109 forming elements therein.

While diamond 107 is employed in this embodiment, a material which is harder than silicon, for example, silicon carbide or sapphire may be employed in place of diamond 107. Incidentally, the modulus of longitudinal elasticity of silicon is $1.7 \times 10^{12}$ dyn/cm²; diamond, $11 \times 10^{12}$ dyn/cm²; sapphire, $4.6 \times 10^{12}$ dyn/cm²; and silicon carbide, $3.9 \times 10^{12}$ dyn/cm².

Figure 2:
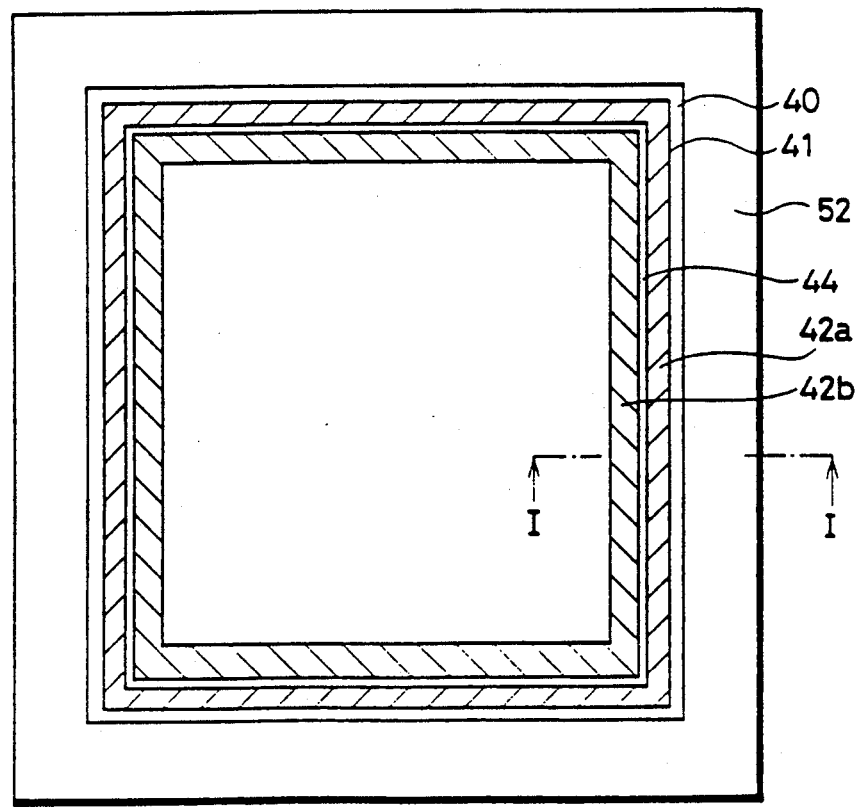
FIG. 2 is a plan view of the third embodiment of this invention.

The third embodiment of this invention is shown in FIG. 2, a plan view of the invention. A silicon substrate 41 is soldered onto a major surface of a die pad 40. At the end portion of the major surface of the silicon substrate 41 are formed field oxide films 42a and 42b and a silicon oxide film 44 along the entire periphery of the major surface thereof. The silicon oxide film 44 is provided between the field oxide films 42a and 42b. The silicon substrate 41 is sealed with resin 52. Bonding pads and external leads are omitted in FIG. 2.

Figure 1:
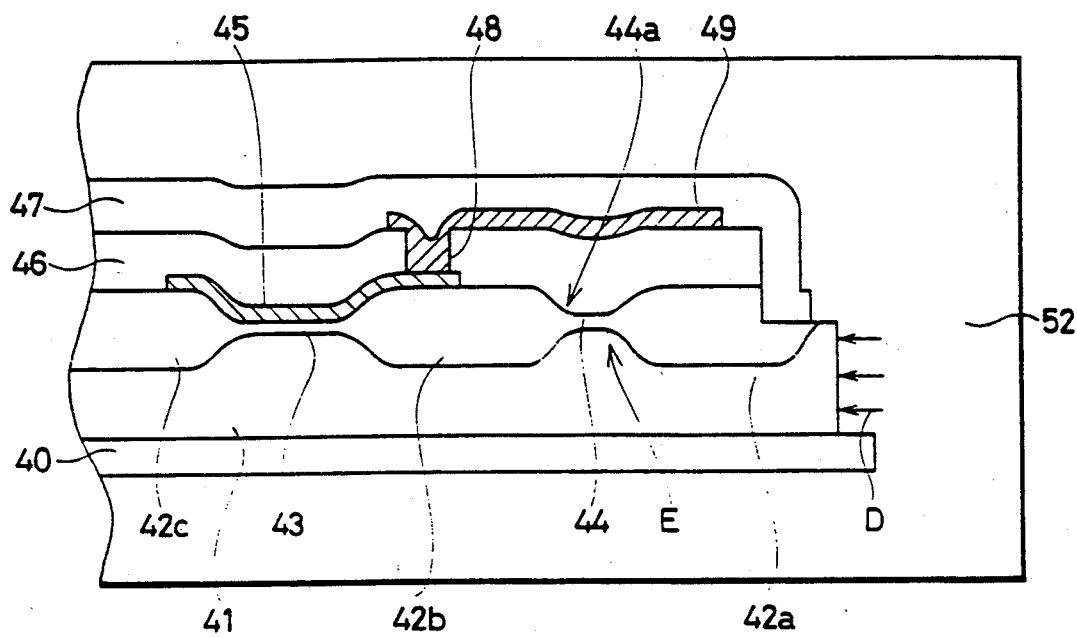
FIG. 1 is a cross sectional view of the end portion of a silicon substrate of a third embodiment of this invention.

FIG. 1 is a cross sectional view taken along the direction of the arrows I of FIG. 2. Referring to FIG. 1, a MOS field effect transistor is formed in a gate oxide film 43. The bottom portion of the silicon substrate 41 is soldered onto a metal plate called the die pad 40. Field oxide films 42a, 42b and 42c are formed in the major surface of the silicon substrate 41. The field oxide film 42a is a buffer member. A thin gate oxide film 43 is formed between the field oxide films 42b and 42c, and the silicon oxide film 44 is formed between the field oxide films 42a and 42b.

A gate electrode 45 made of polysilicon is formed on the field oxide films 42b and 42c and the gate oxide film 43. Since FIG. 1 is a section view of the silicon substrate 41 taken along the gate electrode 45, neither source nor drain region can be seen. An interlayer insulating film 46 made of phospho-silicate glass is formed on the gate electrode 45, the field oxide films 42a, 42b, 42c and the silicon oxide film 44. A contact hole 48 is made through the interlayer insulating film 46 atop the field oxide film 42b. The contact hole 48 is formed by making the interlayer insulating film 46 on the field oxide film 42a subject to reactive ion etching. An aluminum interconnection layer 49 is formed on the interlayer insulating film 46. The aluminum interconnection layer 49 and the gate electrode 45 are electrically connected through aluminum filled in the contact hole 48. A passivation film 47 made of silicon on the aluminum interconnection layer 49. The semiconductor substrate 41 in the above described state is sealed with resin 52.

The silicon substrate 41 is made of silicon, the modulus of longitudinal elasticity of which is $1.7 \times 10^{12}$ dyn/cm². The field oxide film 42a is made of silicon dioxide, the modulus of longitudinal elasticity of which is $0.7 \times 10^{12}$ dyn/cm². Therefore, the field oxide film 42a is softer than the silicon substrate 41. Accordingly, due to the shrinkage of resin, mechanical stresses applied to the side portion of the silicon substrate 41, as shown by the arrow D in FIG. 1, are transmitted from the side surface of the silicon substrate 41 to the field oxide film 42a and reduced by absorption in the field oxide film 42a. Further, a portion of the silicon substrate 41 shown by the arrow E is provided between the field oxide films 42a and 42b; the silicon substrate 41 is harder than the field oxide films 42a and 42b. Therefore, the portion of the silicon substrate 41, shown by the arrow E, prevents mechanical stress in film 42a from being transmitted to the gate oxide film 43 in which the MOS field effect transistor is formed.

Elements located within 100 μm from the end portion of the silicon substrate are especially susceptible to the mechanical stresses applied to the side surface of the silicon substrate. Therefore, this invention is particularly effective to such elements.

A valley portion 44a is formed between the field oxide films 42a and 42b, with only the thin silicon oxide film 44 lying therein. Therefore, the mechanical stresses are less transmitted from the field oxide film 42a through the silicon oxide film 44 to the field oxide film 42b, than the case that the valley portion 44a is filled with the field oxide film. Accordingly, provision of the valley portion 44a between the field oxide films 42a and 42b causes the mechanical stresses transmitted to the gate oxide film 43 to be further reduced.

The field oxide film 42a being a buffer member can be formed by employing the LOCOS (Local Oxidation of Silicon) method. A method of forming the field oxide film 42a by employing the LOCOS method will be described with reference to FIGS. 3A–3C.

Figure 3A:
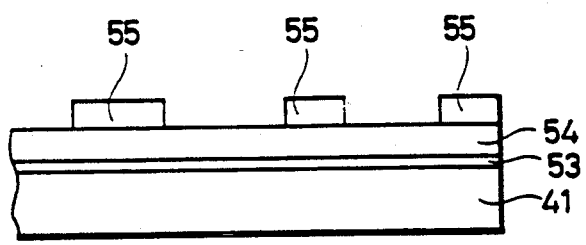
FIGS. 3A–3C are cross sectional views showing in turn the steps of a method of forming a field oxide film which is a buffer member.

First, as shown in FIG. 3A, a silicon oxide film 53, a silicon nitride film 54 and a resist 55 are stacked in turn on a major surface of the silicon substrate 41. The resist 55 is then subject to a predetermined patterning.

Figure 3B:
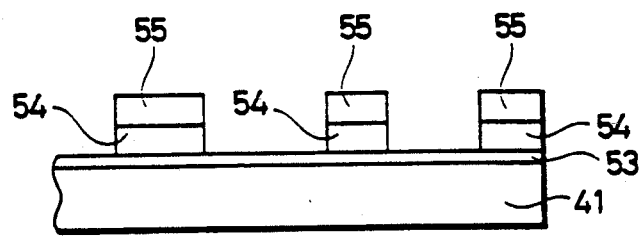

As shown in FIG. 3B, the silicon nitride film 54 is selectively etched away, with the resist 55 used as a mask, and the resist 55 is then removed.

Figure 3C:
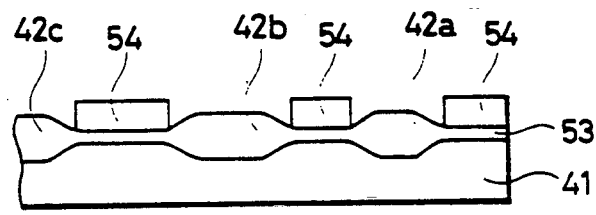

As shown in FIG. 3C, the field oxide films 42a, 42b and 42c are formed by thermally oxidizing the silicon substrate 41, with the silicon nitride film 54 used as a mask. The silicon nitride film 54 is then removed. The field oxide film 42a is formed to serve as a buffer member through the above described steps.

Therefore, if the field oxide film 42a of a buffer member is formed by the LOCOS method, the field oxide films 42b and 42c being insulating films for isolation and the buffer member can be formed at the same time, resulting in highly efficient manufacturing steps of the semiconductor device. Furthermore, the LOCOS method facilitates the simultaneous formation of the field oxide film 42a. Field oxide films 42a and 42b can be formed to the same thickness using the LOCOS method.

The semiconductor elements are formed by employing the silicon substrate in this embodiment; however, silicon carbide or diamond with a higher elastic modulus than silicon may be employed.

Moreover, the silicon oxide film is employed as a buffer member in this embodiment; however, any insulating material having an elastic modulus smaller than that of the semiconductor substrate may be employed.

Further, while the general mechanical stresses caused by resin encapsulation are reduced in this embodiment, the mechanical stresses on the sides of the silicon substrate can also be reduced according to this embodiment.

A pn junction is particularly susceptible to the mechanical stresses. Therefore, the field oxide film, serving as the buffer member, may be formed only between an element having the pn junction, e.g. a MOS transistor and the end portion of the silicon substrate. Based on this, the fourth embodiment of this invention is described with reference to FIG. 4.

Figure 4:
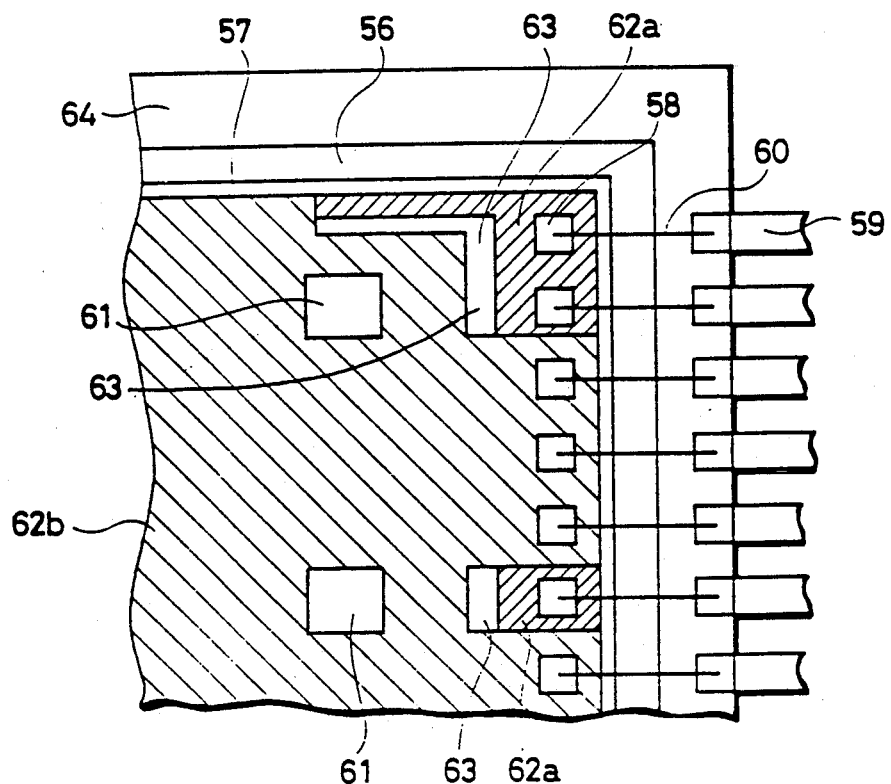
FIG. 4 is a plan view of the end portion of a silicon substrate of a fourth embodiment of this invention.

FIG. 4 is a plan view of the end portion of a semiconductor chip sealed with resin. A silicon substrate 57 is mounted on a die pad 56 as shown in FIG. 4. Bonding pads 58 are formed at a sidewall surface of the major surface of the silicon substrate 57, and external leads 59 and bonding pads 58 are electrically connected to each other by wires 60. MOS transistor forming regions 61 are provided on the major surface of the silicon substrate 57. Field oxide films 62a, serving as a buffer member, are formed only between the MOS transistor forming regions 61 and the sidewall surfaces of the silicon substrate 57. Field oxide film can be formed around the entire periphery of the substrate thereof. Thin oxide films 63 are formed between the field oxide films 62a and the MOS transistor forming regions 61. The silicon substrate beneath the thin oxide films 63 prevents the mechanical stresses not absorbed and reduced in the field oxide films 62a from being transmitted to the MOS forming regions 61. A field oxide film 62b is formed in a portion of the major surface of the silicon substrate 57 other than those occupied by the thin oxide films 63, the MOS transistor forming regions 61 and the field oxide films 62a. The semiconductor chip as described above and portions of the external leads 59 are then sealed with resin 64.

Figure 5:
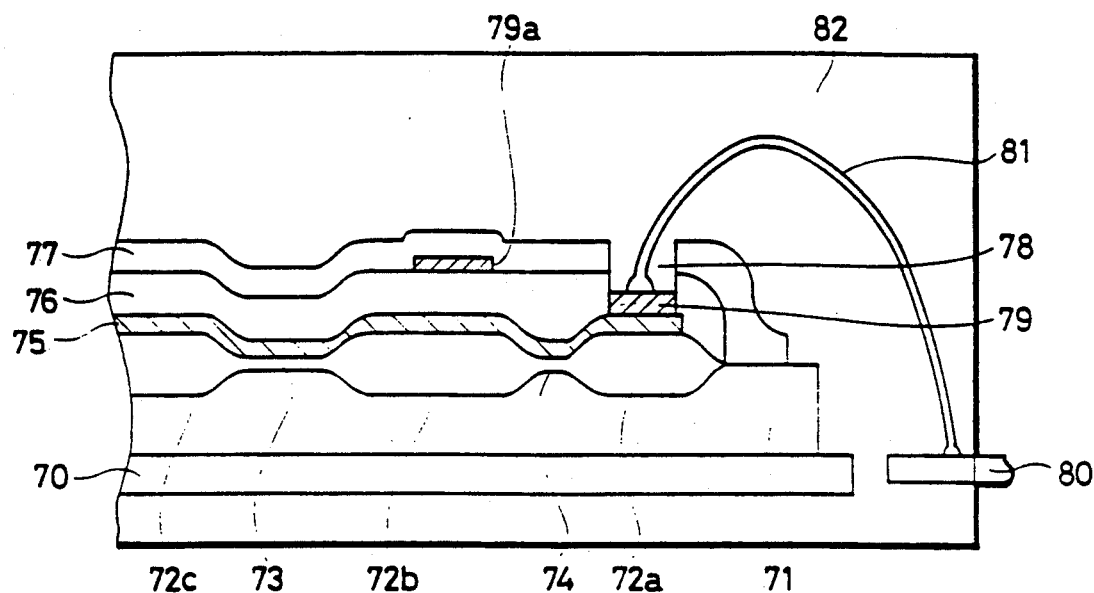
FIG. 5 is a cross sectional view of the end portion of a silicon substrate of a fifth embodiment of this invention.

The fifth embodiment of this invention is shown in FIG. 5, a cross sectional view of an area near a sidewall surface of a silicon substrate. A MOS field effect transistor is formed with a gate oxide film 73. The bottom portion of a silicon substrate 71 is soldered onto a metal plate called a die pad 70. Field oxide films 72a, 72b and 72c are formed in a major surface of the silicon substrate 71. The field oxide film 72a serves as a buffer member. A thin gate oxide film 73 is formed between the field oxide films 72b and 72c. A silicon oxide film 74 is formed between the field oxide films 72a and 72b.

A gate electrode 75 made of polysilicon is formed on the field oxide films 72a, 72b and 72c, the gate oxide film 73 and the silicon oxide film 74. The gate electrode 75 extends over the silicon oxide film 74 and the field oxide film 72a. This embodiment is different from the former embodiments in this point. Since FIG. 5 is a cross sectional view of the silicon substrate 71 taken along the gate electrode 75, no source or drain region can be seen. An interlayer insulating film 76 made of a phospho-silicate glass is formed on the gate electrode 75. An aluminum interconnection layer 79a is formed on the interlayer insulating film 76. A passivation film 77 made of silicon nitride is formed on the interlayer insulating film 76. A contact hole 78 is made through the interlayer insulating film 76 and the passivation film 77 above the field oxide film 72a. The contact hole 78 is made by reactive ion etching of the passivation film 77 and the interlayer insulating film 76 above the field oxide film 72a. A bonding pad 79 made of aluminum is provided in the contact hole 78, and the bonding pad 79 is electrically connected to the gate electrode 75. The bonding pad 79 and an external lead 80 are electrically connected through a wire 81 made of gold. The semiconductor substrate 71 in the above described state and a portion of the external lead 80 are sealed with resin 82.

A specific effect of this embodiment will now be described. In this embodiment, the gate electrode 75 extends over the silicon oxide film 74 and the field oxide film 72a. The contact hole 78 provided on the field oxide film 72a allows electrical connection between the gate electrode 75 and the bonding pad 79. Therefore, this embodiment is effective in the case that the aluminum interconnection layer 79a need be provided on the interlayer insulating film 76 formed on the field oxide film 72b.

For the resin sealed semiconductor device in accordance with this invention, the concave portion located between the insulating film for isolation and the end portions of the semiconductor substrate, in the major surface thereof, is filled with the buffer member made of the material having a smaller elastic modulus than that of the semiconductor substrate, so that the mechanical stress applied to the side surface of the semiconductor substrate is absorbed and reduced by the buffer member. Thus, the portion of the semiconductor substrate located between the insulating film for isolation and the concave portion prevents the reduced mechanical stress from being transmitted to the element forming region. Therefore, the elements formed in the end portions of the major surface of the semiconductor substrate becomes less susceptible to the mechanical stresses applied to the side surface of the semiconductor substrate, resulting in no deterioration of the electrical characteristics caused by the mechanical stresses.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a substrate of a predetermined modulus of elasticity and having a major surface including a concave portion formed proximate the periphery of said substrate and at least one sidewall surface of said substrate, said concave portion having a central portion with substantially uniform depth;
   at least one electrical element formed at said major surface of said substrate; and
   a structure formed in said central portion of said concave portion of said major surface of said substrate for reducing mechanical stresses in said substrate caused by resin encapsulation, said structure comprising:
   a region of material of lower modulus of elasticity than said substrate modulus of elasticity,
   a field oxide region formed between said material of lower modulus of elasticity and said electrical element, and
   an intermediate region positioned between and separating said material of lower modulus of elasticity and said field oxide region, said intermediate region made of a material different than that of said substrate and having a modulus of elasticity equal to or greater than said modulus of elasticity of said substrate, said intermediate region being affixed to said substrate.

* * * * *